United States Patent [19]

Kubo et al.

[11] 4,011,581
[45] Mar. 8, 1977

[54] MOSFET ANTIPARASITIC LAYER
[75] Inventors: Masaharu Kubo, Hachioji; Minoru Nagata; Yasunobu Kosa, both of Kodaira, all of Japan
[73] Assignee: Hitachi, Ltd., Japan
[22] Filed: Sept. 2, 1970
[21] Appl. No.: 68,973
[30] Foreign Application Priority Data
  Sept. 5, 1969 Japan ............................ 44-70000
[52] U.S. Cl. ................................. 357/52; 357/13; 357/23; 357/41; 357/42; 357/60
[51] Int. Cl.² ................. H01L 29/78; H01L 27/04
[58] Field of Search .................. 357/23, 13, 41, 52
[56] References Cited
UNITED STATES PATENTS

| 3,440,502 | 4/1969 | Lin et al. ............................ 317/235 |
| 3,512,058 | 5/1970 | Khajezadeh et al. ............... 317/235 |
| 3,514,845 | 6/1970 | Legat et al. ......................... 29/571 |
| 3,532,945 | 10/1970 | Weckler ............................ 317/235 |
| 3,555,374 | 1/1971 | Usuda ............................... 317/235 |
| 3,577,043 | 5/1971 | Cook ................................. 317/235 |

FOREIGN PATENTS OR APPLICATIONS

| 6,802,684 | 8/1968 | Netherlands ....................... 317/235 |
| 6,802,685 | 8/1968 | Netherlands ....................... 317/235 |

*Primary Examiner*—William D. Larkins
*Attorney, Agent, or Firm*—Craig & Antonelli

[57] ABSTRACT

A semiconductor device which is provided, for the purpose of eliminating parasitic MOSFETs formed between at least two circuit elements (such as MOSFET, TRANSISTOR, RESISTOR, and the like) on a semiconductor substrate, with a high impurity concentration layer of the same conduction type as the substrate in a manner such that the layer is not only in the semiconductor substrate between said circuit elements but is also partially overlapped by the circuit element regions.

15 Claims, 15 Drawing Figures

MOSFET ANTIPARASITIC LAYER

The present invention relates to a novel semiconductor device which is formed of a plurality of electric circuit elements including insulating gate type field effect transistors (MOSFET), and if necessary, resistors, diodes, etc. on a semiconductor substrate surface and in which so-called parasitic MOSFETs formed parasitically between said circuit elements have been eliminated.

An insulating gate type field effect transistor, abbreviated as MOSFET, is constructed by the following process. In a main surface of a semiconductor substrate of first conductivity type, regions of second conductivity type which are opposite to the substrate in their conductivity type and are to serve as source and drain electrodes are provided separately; next, source and drain metal electrodes are respectively brought into contact with the regions, and the intermediate region (hereinafter referred to as a gate region) between the source electrode region and the drain electrode region is covered with an insulating layer on which is further formed a gate metal electrode.

It has been frequently put into practice in an MOS type IC or LSI that a plurality of MOSFETs are formed on a main surface of a semiconductor substrate so as to be interconnected in accordance with a predetermined circuit constitution.

In this case, it is known that parasitic MOSFETs are formed between the MOSFETs with the connecting electrodes of the MOSFETs as gate electrodes so that the electrical characteristics are greatly influenced.

Now, the reason why parasitic MOSFETs are formed will be described taking as an example the circuit constitution of two inverters which is the most fundamental of MOS IC or LSI.

FIG. 1 is a diagram showing the constitution of an inverter circuit; FIG. 2 is an enlarged top view of a part of the IC wafer when the inverter circuit in FIG. 1 is formed in IC; FIG. 3 is the cross-sectional view taken along the broken line 15, 16, 17 in FIG. 2. Now, only an essential part is enlarged to be shown for convenience of description as regards a P-channel MOSFET, however, it will be noted that this does not mean any limitation.

Referring to FIG. 1, numerals 1 and 2 are input terminals of inverters while 3 and 4 are output terminals of the inverters. Numerals 5 and 6 are supply terminals commonly used for both the inverters. Numeral 5 is at the earth potential and 6 is at the lowest $V_{GG}$ of the negative potentials employed in IC or LSI. Numerals 7, 8, 9 and 10 are MOSFETs constituting the inverters.

In FIGS. 2 and 3, the same numerals and symbols as in FIG. 1 designate the identical elements. Portions inside solid lines such as 11 are evaporated metal layers such as Al. Portions inside solid lines such as 12 are P$^+$ diffused layers. Hatched portions such as 13 are gate electrodes of MOSFETs and shaded portions such as 14 are communicating portions between the metal layers and the semiconductor layers (P$^+$ diffused layers).

In FIG. 3, numeral 18 is an N-type substrate, numeral 19 is a thin insulating layer corresponding to the gate region of a MOSFET, numeral 20 is a thick insulating layer corresponding to the outside of the gate region.

In the drawings, the portion 21 as in FIG. 3 is called a parasitic MOSFET. That is, in such a portion, the metal layer 6 is perpendicular through the insulation layer 20 to P$^+$ diffused layer regions 22 and 23 so that a Metal-Insulator-Semiconductor structure (MIS type structure) like MOSFET 7 is formed, and a MOSFET is formed when the bias voltage is conveniently applied. This causes unnecessary connections between the inverters (FIG. 1, 21), and the deterioration in the operation characteristics, sometimes the non-functioning of the operation may result.

The typical methods which have been previously adopted in order to prevent the above-mentioned effect of a parasitic MOSFET are as follows. (1) making thicker the insulating layer 20 on the region 21 where the parasitic MOSFET is formed (gate region), and (2) forming an N$^+$ diffused layer (FIG. 2, 27, for example) in the gate region 21 of the parasitic MOSFET to cut the channel of the MOSFET.

Now, in accordance with the method (1), in order to completely eliminate the effect of the parasitic MOSFET, it is necessary that the thickness of the insulating layer 20 of the gate region of the parasitic MOSFET is about 15 to 20 times more than the insulating layer 19 of the gate region of the regular MOSFET. That is, as the thickness (Tox 19) of the regular insulating layer 19 is at most about 1,000 A, the thickness (Tox 20) of the insulating layer 20 is required to be about 15,000 to 20,000 A. Then, the strength of fastening, for example, at the steps between 19 and 20, at the peripheries around the communicating openings 24 or 14, or, in case of metal and photo-resist working, at the concave portions such as contact gate regions in their contact-printing, is not sufficient, and the accuracy of working is deteriorated, so that occasionally the metal wiring may become detached.

In accordance with the method (2), the concentration of diffused N$^+$ is higher than about $10^{18}$ atoms/cm$^3$. Therefore, while parastic MOSFETs are completely prevented from forming, the N$^+$ diffused layer 27 must not be allowed to overlap with the P$^+$ diffused layers 22 and 23. For, if they are overlapped, the breakdown-voltage of the P-N junction there will decrease to cause the operation of MOSIC or LSI to be impossible. Accordingly, proper spacings (about 5 to 10 $\mu$) are necessary on both sides of 27, which increases the required area by 30 to 50% and decreases the degree of integration in IC or LSI, and in addition, makes it disadvantageous in cost.

The parasitic MOSFET as described above is formed not only between MOSFETs, but also between a MOSFET and other electric circuit elements such as a diffusion resistance and diodes formed on the surface of the semiconductor substrate.

The present invention attempts to solve the problems in the prior art as described above. And the object of the present invention is to eliminate parasitic MOSFETs.

The gist of the present invention consists in a semiconductor device having a semiconductor substrate whose one main surface is covered with a predetermined insulation material and in which main surface a plurality of electric circuit elements including insulating gate type field effect transistors utilizing said insulating film, and if necessary, resistances, diodes, and the like are formed and interconnected through a connecting metal layer provided on said insulating film, characterized in that, in order to eliminate from said semiconductor substrate a so-called parasitic insulation gate type field effect transistor (parasitic MOSFET)

which is constituted by said connecting metal layer for connecting said electric circuit elements operating as a gate electrode, one of two adjacent electric circuit element regions operating as a source electrode region, and the other of said two adjacent electric circuit element regions operating as a drain electrode region, a high impurity concentration layer having the same conductivity type as that of said gate electrode is provided, said layer overlapping with the semiconductor surface region (the gate region of the parasitic MOSFET) which is directly under the connecting electrode constituting the gate electrode of said parasitic MOSFET and is between the regions each constituting the source electrode and the drain electrode of said parasitic MOSFET, and at least one of said source electrode region and drain electrode region of said parasitic MOSFET, and being, when over laps with said drain region and/or source region in normal MOSFET, so high in its impurity concentration as not to lower the breakdown voltage of PN junction in said source and drain regions at said overlapping, in particular, said impurity concentration in said high impurity concentration layer being selected to range from $1.5 \times 10^{16}$ atoms/cc to $2 \times 10^{17}$ atoms/cc.

As the present invention has the constitution as described above, the following effects can be achieved.

1. The high impurity concentration layer is sufficiently effective for eliminating the parasitic MOSFET without making thicker, as in the prior art, the part of the insulating layer on the semiconductor substrate layer where the parasitic MOSFET appears to be formed.

2. Since it is not necessary that the part of the insulating layer where the parasitic MOSFET appears to be formed is to be made thicker, the steps formed on the insulating layer may be low. As a result, the phenomena of the connecting metal layer being cut at the steps rarely take place.

3. As it is possible for the insulating film to be made thinner, the accuracy of the opening of the insulating in the contact portion and that of working in the metal connecting layer and the like can be enhanced.

4. The breakdown voltage of a PN junction between the high impurity concentration layer and the drain or source region is maintained sufficiently high as compared with the operating voltage of a normal MOSFET by properly selecting the impurity concentration for the above-mentioned high impurity concentration layer as specified above. As a consequence, it becomes possible to make the source region and drain region of the parasitic MOSFET (22 and 23 in FIG. 2, for example) become adjacent and to enhance the degree of integration in Ic or LSI.

FIGS. 1 to 3 show the constitution of a known inverter circuit, in which,

FIG. 1 is the circuit diagram,

FIG. 2 is a top view of the IC, and

FIG. 3 is a longitudinal cross-sectional view of the IC.

FIGS. 4 and 5 show an embodiment of the present invention illustrating the improved IC of the inverter, in which, FIG. 4 is a top view of the IC, and FIG. 5 is a longitudinal cross-sectional view of a part of the IC.

FIGS. 11, 12a and 12b show another embodiment of the present invention, in which, FIG. 11 is a gate circuit diagram of a MOSFET, and FIGS. 12a and 12b are, respectively, enlarged cross-sectional views of essential parts circuit as shown in FIG. 11 when it is formed in IC in accordance with the present invention.

The above and other features and effects of the present invention will be apparent from the following description concerning illustrative embodiments of the present invention.

Figure 2:
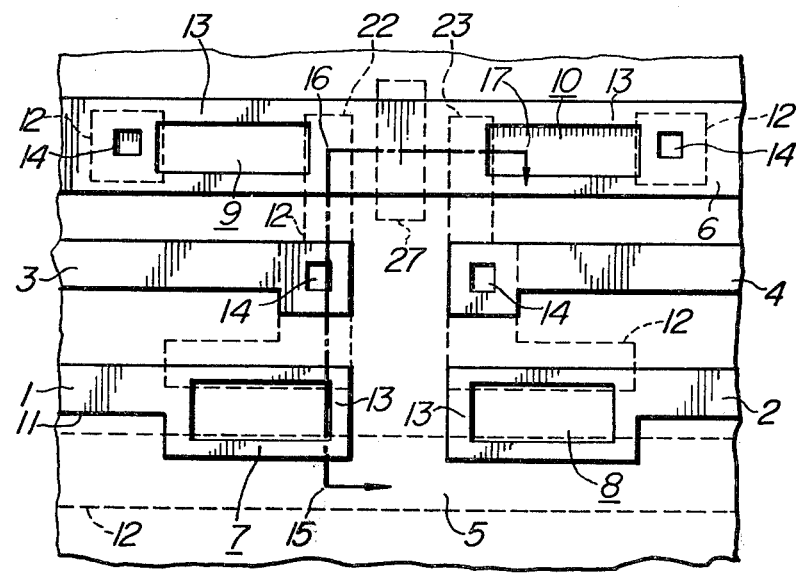
Figure 3:
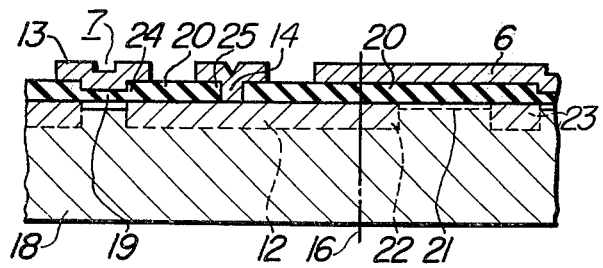
Figure 4:
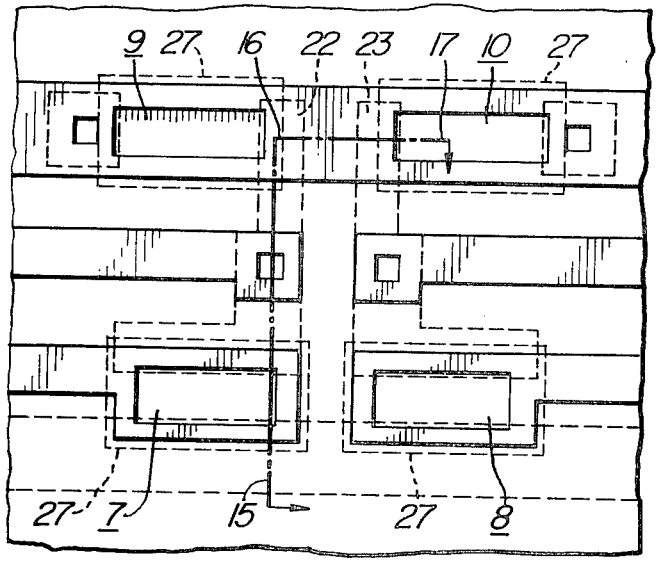
Figure 5:
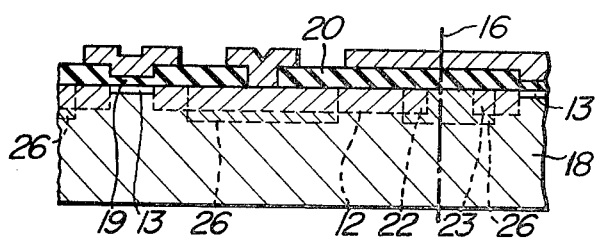

FIGS. 4 and 5 show an integrated circuit of an inverter circuit obtained by improving the known circuit as shown in FIGS. 2 and 3 to completely eliminate the parasitic MOSFET. Accordingly, the same numeral designates the same or corresponding element. A feature in FIGS. 4 and 5 is an $N^+$ diffused layer 26 is provided deeper in $P^+$ layers throughout the surface of a semiconductor substrate except the gate region 13 of a regular MOSFET.

In FIG. 4, all the region outside squares 27 is the $N^+$ diffused layer.

In the present invention, the impurity concentration in a high impurity concentration layer is limited within a range in order for this invention to be effective without lowering the electric characteristics of the MOSFET.

In the following, a process to determine the range of the impurity concentration in the high impurity concentration layer will be exemplified.

One factor to determine the operation characteristics of a MOSIC or LSI is the threshold voltage $V_{th}$. $V_{th}$ is determined by several factors such as the thickness Tox 19 of the insulating layer (gate insulating layer) 19 in FIG. 3, the impurity concentration N in the $N^-$ type substrate 18, the carrier concentration $Q_{ss}$ induced in the surface directly under the insulating layer 20, and the selection of crystal axes, and the most preferable condition at present appears to be as follows. The crystal surface of the semiconductor substrate is [100] surface, $T_{ox19} = 1000$ A, $N = 1 \sim 5 \times 10^{15}/cm^3$, and $Q_{ss} = 2 \times 10^{11}/cm^2$, then $V_{th} = -1.8 \sim 2.4$ V results.

Figure 1:
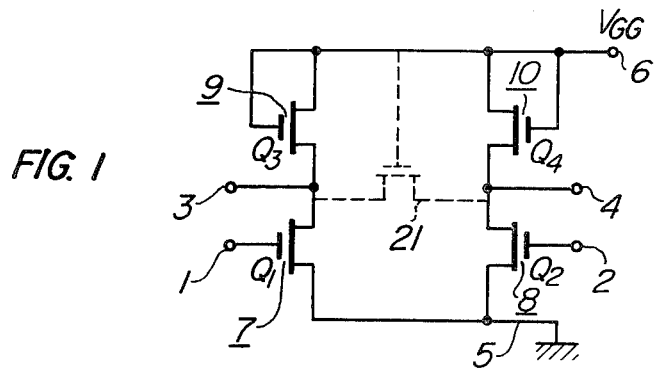

Next, the source voltage $V_{GG}$ of 6 in FIGS. 1 to 3 is required to have about six times $V_{th}$ as its maximum value, that is, $|V_{gg}| \leq 15.2$ V.

Therefore, in order for the present invention to be effective, it is required that $N^+$ be diffused for the threshold voltage $V_{th}$ of the parasitic MOSFET and the breakdown voltage $V_{PN}$ of the $P^+N^+$ junction to be higher than about 15 V. Further, as an additional condition, the thickness $T_{ox20}$ of the thick insulating layer 20 in FIG. 3 should preferably meet the condition $T_{ox20} < 10,000$ A in order to prevent the wiring metal as described before such as Al from being cut at step of the insulating layer.

Figure 6:
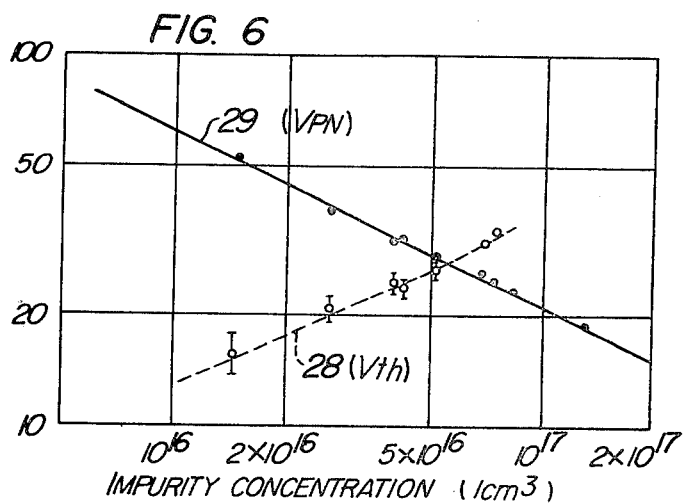
FIG. 6 is a graph obtained for determining the impurity concentration in an $N^+$ diffused layer in accordance with the present invention, illustrating the relation between the threshold voltage of a parasitic MOS-FET or the breakdown voltage of a PN junction and the concentration of a N type impurity.

The curve 28 in FIG. 6 shows an experimental result obtained by plotting $V_{th}$ of the parasitic MOSFET with the impurity concentration N in 26 taken as a variable when $T_{ox20} = 10,000$ A. In accordance with this curve, the following condition required for N results.

$$N \geq 1.5 \times 10^{16}/cm^3$$

Next, the curve 29 in FIG. 6 shows an experimental result obtained by plotting breakdown voltage $V_{PN}$ with N taken as a variable, giving the following condition.

$$N \leq 2 \times 10^{17}/cm^3$$

As a result, the optional range for N is as follows.

$$1.5 \times 10^{16}/cm^3 \leq N \leq 2 \times 10^{17}/cm^3$$

It is possible to completely eliminate the parasitic MOSFET by selecting the value of N within the above-described range.

When N is selected to be less than $1.5 \times 10^{16}/cm^3$, the threshold voltage of the parasitic MOSFET becomes less than 15 V so that the parasitic MOSFET is caused to be in operation by the source voltage of IC (about 15 V) and the deterioration in the electric characterisitics results. When N is selected more than $2 \times 10^{17}/cm^3$, the breakdown voltage of the PN junction becomes less than 15 V so that the PN junction in each MOSFET is brought into breakdown and use becomes impossible.

The above-mentioned range of the impurity concentration in the high impurity concentration layer is, of course, valid only when, as described before, the crystal surface of the semiconductor is [100], $T_{ox19} \simeq 1000$ A, $N = 1 \sim 5 \times 10^{15}$ atoms/cc, and $Q_{ss} = 2 \times 10^{11}/cm^2$, and the range will be different when other conditions are given. However, the determination of the range can be performed by the process as given in the above description concerning FIG. 6.

Figure 7:
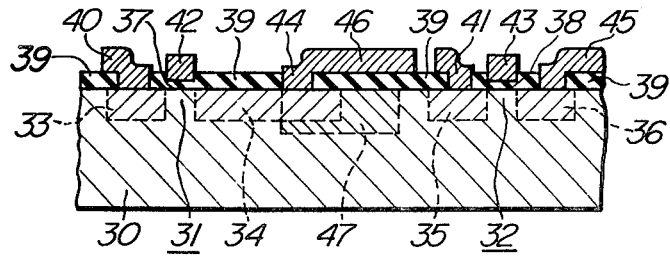
FIG. 7 is a longitudinal cross-sectional view illustrating another embodiment of the present invention.

FIG. 7 shows another embodiment of the present invention. Though, in the embodiment as described above, the high impurity concentration layer to eliminate the parasitic MOSFET is overlapped with both the source and drain regions of the parasitic MOSFET, it is not always necessary for the high impurity concentration layer to overlap with both the source and drain regions in order that the present invention is effective. The overlapping of the high impurity concentration layer with only the P type diffused region forming the source region (or drain region) of the parasitic MOSFET as shown in FIG. 7 is sufficient for the effect of the present invention.

Referring to FIG. 7, numeral 30 is a silicon substrate of an N conductivity type on the surface of which are formed a first MOSFET 31 and a second MOSFET 32. The source regions 33 and 35 and the drain regions 34 and 36 of respectively the first and second MOSFETs are provided by diffusing a P type impurity into predetermined portions on the substrate surface. Numerals 37 and 38 are gate insulating layers formed of $SiO_2$ film, numeral 39 is a comparatively thick (about 10,000 A) $SiO_2$ layer covering the silicon substrate except the MOSFETs. Numerals 40 and 41, 42 and 43, and 44 and 45 are, respectively, source electrode, gate electrode, and drain electrode of the first and second MOSFETs. Numeral 46 is a connection conductor (aluminum evaporated layer) extending from the drain electrode of the first MOSFET to the $SiO_2$ film 39.

Usually, a parasitic MOSFET is composed of 34 as a source region (or drain region), 35 as a drain region (or source region), and 46 as a gate electrode. However, when a high impurity concentration layer 47 is provided so as to overlap with 34, the parasitic MOSFET does not operate at all under the normal operating condition of the first and second MOSFETs, that is, the parasitic MOSFET is substantially eliminated.

Though the first and second MOSFETs are shown to be far apart in this embodiment for convenience of description, it is possible for them to be closer to each other.

Further, the high impurity concentration layer is provided only between the first and second MOSFETs in this embodiment, however, it may be possible that the high impurity concentration layer 47 is provided so as to surround the first MOSFET.

Figure 8:
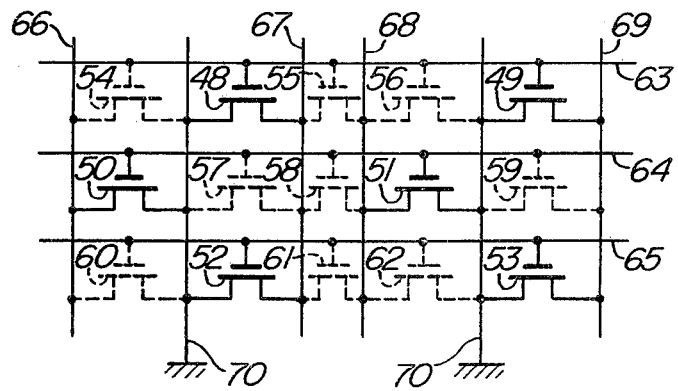
FIGS. 8 to 10 show another embodiment of the present invention, in which, a comparison is made between the two cases where a MOSFET circuit as shown in FIG. 8 is formed in IC according to the prior art (FIG. 9) and the present invention (FIG. 10).
Figure 9:
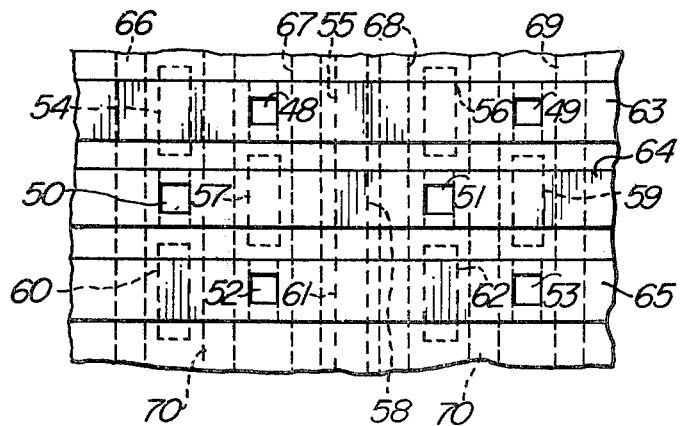
Figure 10:
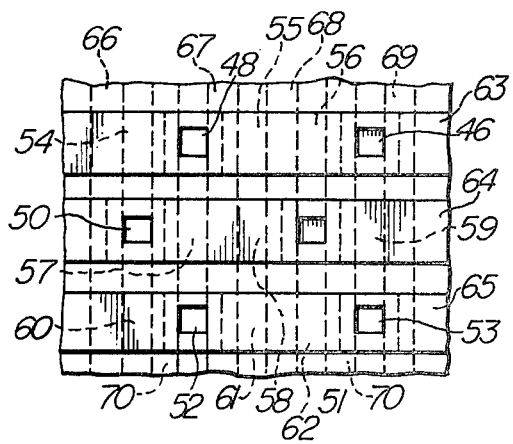

FIGS. 8 to 10 show another embodiment in which, in accordance with the present invention, the dimension of a MOS array can be effectively reduced.

FIG. 8 is a circuit diagram of a MOS array. FIG. 9 is a layout plan view on a semiconductor substrate embodying the circuit as shown in FIG. 8 in accordance with the prior N- diffusion process. FIG. 10 is a layout plan view on a substrate surface in accordance with the present invention.

Referring to FIGS. 8 to 10, numerals 48, 49, 50, 51, 52 and 53 are MOSFETs constituting an array. Numerals 54, 55, 56, 57, 58, 59, 60, 61 and 62 are the regions where parasitic MOSFETs are formed for constructional reasons. numerals 63, 64 and 65 are metal wirings which serve as gate electrodes of the MOSFETs. While numerals 66, 67, 68 and 69 serve as drain electrodes of the MOSFETs, respectively, when they are P+ diffused, numeral 70 is a P+ diffused ground wiring which serves as a source of the MOSFETs. In the structure shown in FIG. 10, an n-type impurity of a high concentration is provided in any portions except those for a part of the drain and source regions and for the whole gate region of the semiconductor substrate surface in order to eliminate any parasitic MOSFETs, as has been mentioned above referring to the case of the embodiment of FIG. 4.

in FIGS. 9 and 10, the following layout is carried out in order to compare dimensions. The width of diffusion is 10 $\mu$, the channel length of a MOSFET is 10 $\mu$, the play between N+ and P+ and that between the metal layer and the gate are all 5 $\mu$. When FIG. 9 and FIG. 10 are compared, both are the same in dimension in the longitudinal-direction as viewed on the drawing, however, in the horizontal-direction, the former is 160 $\mu$ while the latter is only 110 $\mu$ in length.

That is, when the present invention is utilized for a MOS array, for example, an improvement of about 30 to 50 percent in area is achieved as compared with the prior art.

A semiconductor device in accordance with the present invention can be formed by the process of selective diffusion of known impurities. That is, one main surface (source and drain regions) of a semiconductor substrate such a N− type silicon substrate is formed. Next, the $SiO_2$ film which has been used as a mask for impurity diffusion may be employed as an insulating layer for MOSFETs. Or, when the $SiO_2$ film used as a mask is contaminated, the old $SiO_2$ film may be completely removed and a new $SiO_2$ film may be coated over the substrate surface by a known process such as high-temperature oxidation, thermal decomposition of silane or organooxisilane, or sputtering, to form an insulating layer of MOSFETs. The insulating layer may not only be an SiO$_2$ film, but also a composite film of an SiO$_2$ film and other insulating film such as Si$_3$N$_4$ and Al$_2$O$_3$.

In accordance with the present invention, it is possible not only to completely eliminate a parasitic MOSFET, but also to bring out the following effect.

Figure 11:
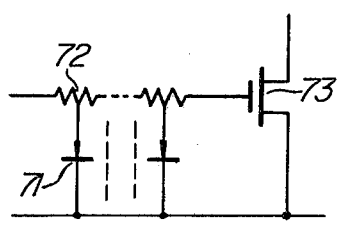

Previously, it has been usual in MOS IC and LSI, in order to prevent the gate insulating layer 19 from external surge when elements are in use, that a gate protective circuit is formed on the same substrate as that of the IC. In FIG. 11, for example, the protecting purpose may be realized by a protective diode 71 and a distributed resistance circuit of P$^+$ diffusion 72. However, when the protective diode is formed of an N type substrate having an impurity concentration of 1 ~ 5 × 10$^{15}$ /cm$^3$ and P$^+$ diffusion as in a MOSFET 73, the breakdown voltage of the junction is more than 100 V.

On the other hand, the puncture voltage V of a gate insulating layer is also about 100 V when the thickness of the gate insulating layer is 1000 A, that is, the difference between the above breakdown voltage and the puncture voltage is nearly zero, therefore, the gate insulating layer is subjected to dielectric breakdown before the diode breaks down, and as a result, MOSFETs have been frequently damaged by accident. Increasing the concentration in the N type substrate in order to lower the breakdown voltage $V_{PN}$ of the junction of the protective diode, and making thicker the gate insulating layer in order to raise the puncture voltage V, both increase the threshold voltage $V_{th}$ of a MOSFET causing the circuit operation to be deteriorated.

Accordingly, some other methods to lower the breakdown voltage of junction $V_{PN}$ have been attempted. One method is to make the P$^+$ diffusion in the protective diode shallow, and another one is to make the thickness of the P$^+$ diffused portion as thin as that of the gate insulating layer.

However, these methods require additive processes causing the cost to be increased and the manufacturing process becomes complicated.

In accordance with the present invention, an N$^+$ diffused layer used to eliminate a parasitic MOSFET can be employed, at the same time, to lower the breakdown voltage of the junction of a protective diode.

Figure 12A:
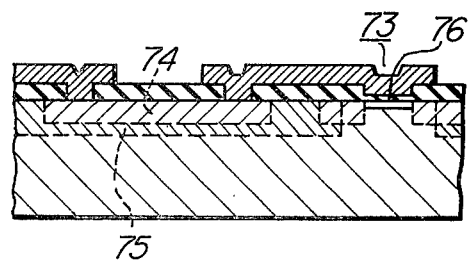
Figure 12B:
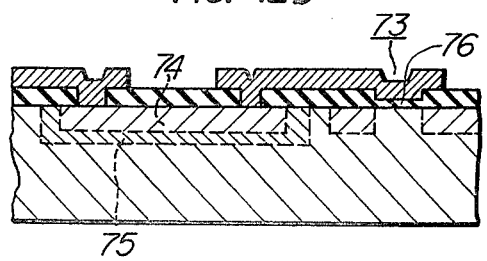

That is, as shown in FIG. 12(a) or (b), an N$^+$ diffused layer 75 is provided around a protective diode 75, where the concentration N of the diffused N$^+$ is within the range, $1.5 \times 10^{16}$ /cm$^3$ < N < $2 \times 10^{17}$ /cm$^3$. By doing so, the breakdown voltage of the junction can be sufficiently lowered without deteriorating the circuit operation of a MOSIC and LSI. For example, the puncture voltage V of a gate insulation layer 76 is about 100 V when the thickness of the gate insulating layer T is 1000 A, while, when the N$^+$ diffused layer 75 is provided, the breakdown voltage of the protective diode 74 becomes 20 to 60 V, so that a sufficient protective (clamping) operation may be obtained.

In the above embodiment, it is possible not only to eliminate a parsitic MOSFET formed between MOSFETs and diffusion resistance, but also to lower the breakdown voltage of a clamping diode.

Figure 13:
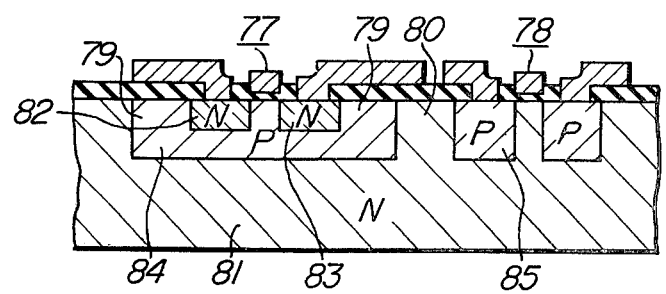
FIGS. 13 and 14 show another embodiment of the present invention, in which, each illustrates an enlarged cross-sectional view of an essential part of a complementary MOSFET element.

The present invention is also effective in complementary MOSFETs as shown in FIG. 13. FIG. 13 illustrates diagramatically the fundamental structure of complementary MOSFETs. Numerals 77 and 78 as shown by arrows are, respectively, an N-channel MOSFET and a P-channel MOSFET. The portions in the complementary MOSFETs where parasitic MOSFETs are formed are the portions as shown by 79 and 80. The portion 79 forms a parasitic MOSFET in which an N type substrate 81, an N type diffused layer 82 or 83, and a P type region 84 respectively serve as a source or drain region, a drain electrode region (or a source region), and a gate region. The portion 80 forms a parasitic MOSFET in which P type regions 84 and 85, and N type semiconductor substrate 81 respectively serve as a source (or drain), a drain (or source), and a gate region.

Figure 14:
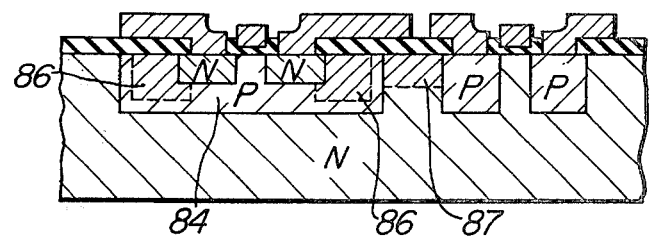

In order to eliminate the above-mentioned parasitic MOSFET without deteriorating the electric characteristics of the original complementary MOSFETs and without increasing the area of the complementary MOSFETs on the semiconductor surface, it suffices that high impurity concentration layers 86 and 87 are provided, as shown in FIG. 14, on the region where the parasitic MOSFETs are to be formed, where numeral 86 is a P$^+$ layer and 87 is a N$^+$ layer.

In FIG. 14, the high impurity concentration layer 86 is formed in the P type impurity diffused layer, and the impurity concentration of the P type layer 84 near the surface of the substrate is high, it is also possible to eliminate the MOSFET formed at 79 in FIG. 3 without forming the layer 86.

What is claimed is:

1. A semiconductor device which comprises
   a. a semiconductor substrate which is of a first conductivity type and has one main surface,
   b. a plurality of semiconductor regions which are of a second conductivity type opposite to said first type and are formed on the main surface of said substrate,
   c. an insulating layer which is provided on said main surface and has openings, and
   d. a wiring metal layer which is provided on said insulating layer, and in which
   a first part of said wiring metal layer is provided through said insulating layer as an intermediary above a gate region formed between at least two neighboring semiconductor regions thereby to from a normal insulating gate type field effect transistor, another semiconductor region is provided adjacent to at least one of said semiconductor regions constituting said insulating gate type field effect transistor, and a second part of said wiring metal layer is provided through said insulating layer as an intermediary above a parasitic gate region formed between said at least one of the semiconductor regions and said other semiconductor region thereby to form a parasitic insulating gate type field effect transistor, characterized in that a high impurity concentration layer having the same conductivity type as that of said substrate and having an impurity concentration higher than that of said substrate is provided in the entire main surface of said semiconductor substrate except the gate region of the normal insulating gate type field effect transistor so as to define PN junctions with said plurality of semiconductor regions, said high impurity concentration layer having a predetermined value of impurity concentration which is low enough to make the breakdown voltage of said PN junctions higher than an operating voltage applied to said wiring metal layer and which is high enough not to induce a parasitic channel layer in said major surface of said substrate under said second part of said wiring metal layer when the operating voltage is applied to said wiring metal layer.

2. A semiconductor device as defined in claim 1, in which the impurity concentration of said high impurity concentration layer ranges from $1.5 \times 10^{16}$ atoms/cc to $2 \times 10^{17}$ atoms/cc.

3. A semiconductor device which comprises
a. a semiconductor substrate which is of a first conductivity type and has one main surface,
b. a plurality of semiconductor regions which are of a second conductivity type opposite to said first type and are formed on the main surface of said substrate,
c. an insulating layer which is provided on said main surface and has openings, and
d. a wiring metal layer which is provided on said insulating layer, and in which
said wiring metal layer is provided through said insulating layer as an intermediary above a gate region formed between at least two neighboring semiconductor regions thereby to form an insulating gate type field effect transistor, another semiconductor region is provided adjacent to at least one of said semiconductor regions constituting said insulating gate type field effect transistor, and a portion of said other semiconductor region and said gate electrode of said insulating gate type field effect transistor are connected by said wiring metal layer through said insulating layer on said semiconductor substrate, characterized in that a high impurity concentration layer having the same conductivity type as that of said substrate and having an impurity concentration higher than that of said substrate is provided in a region which is in said main surface of said semiconductor substrate and between said other semiconductor region and that one of said neighboring semiconductor regions which is adjacent to said other semiconductor region and constituting said insulating gate type field effect transistor, in a manner such that said high impurity concentration layer bridges said other semiconductor region and said semiconductor region being adjacent to said other semiconductor region and constituting said insulating gate type field effect transistor under said wiring metal layer and defines a PN junction with said other semiconductor region, said high impurity concentration layer having a predetermined value of impurity concentration which is low enough to make the breakdown voltage of said PN junction higher than an operating voltage applied to said wiring metal layer and which is high enough not to cause an inversion layer to be induced in the main surface of said high impurity concentration layer under said wiring metal layer due to the operating voltage applied to said wiring metal layer.

4. A semiconductor device as defined in claim 3, in which the impurity concentration of said high impurity concentration layer ranges from $1.5 \times 10^{16}$ atoms/cc to $2 \times 10^{17}$ atoms/cc.

5. A semiconductor device comprising:
a semiconductor body having
a major surface,
a first semiconductor region of a first conductivity type extending to said major surface,
a second and third semiconductor regions of a second conductivity type formed in said first semiconductor region and extending to said major surface, and
a fourth semiconductor region of said first conductivity type formed in said first semiconductor region between said second and third semiconductor regions so as to bridge said second and third semiconductor regions and extending to said major surface, said fourth semiconductor region defining a first and a second pn junction terminating at said major surface with said second and third semiconductor regions, respectively;
an insulating film formed on said major surface of said semiconductor body, so as to cover at least said major surface between said second and third semiconductor regions; and
a conducting layer connected to said second semiconductor region and extending over said insulating film so as to cross over said first and second pn junctions through said insulating film, said fourth semiconductor region having a predetermined value of impurity concentration low enough to make the breakdown voltage of said first pn junction higher than an operating voltage to be supplied to said conducting layer but high enough not to cause an inversion layer to be induced in the major surface of said fourth semiconductor region under said conducting layer due to the operating voltage supplied to said conducting layer.

6. A semiconductor device according to claim 5, wherein said semiconductor body is made of silicon, said insulating film consists essentially of silicon oxide and said fourth semiconductor region is of n conductivity type silicon and has an impurity concentration in the range of $1.5 \times 10^{16}$ atoms/cc to $2 \times 10^{17}$ atoms/cc.

7. An insulating gate type semiconductor integrated circuit device comprising:
a semiconductor body having a major surface;
a first semiconductor region of a first conductivity type formed in said body and extending to the major surface, said first semiconductor region being a single unit and perforated with a plurality of openings therein, semiconductor portions of said body extending into the openings of said first semiconductor region, said portions of said body extending to a major surface common with said first semiconductor region;
a plurality of insulated gate type semiconductor devices each formed on each of said portions of said body, respectively, each device having a pair of second and third semiconductor regions of a second conductivity type formed in a portion of said body extending to the major surface, so as to define PN junctions with said first semiconductor regions;
a first insulating film covering the major surface of the portion between said pair of second and third semiconductor regions;
a second insulating film covering the major surface of said first semiconductor region;
a conducting layer formed on said first insulating film, so as to cover the major surface of the portion between said pair of second and third semiconductor regions and extending over said second insulating film, said first semiconductor region having a predetermined value of impurity concentration which is low enough to make the breakdown voltage of said PN junctions higher than an operating voltage to be applied to said conducting layer and which is high enough not to cause an inversion layer to be induced in the surface of said first semiconductor region under said conducting layer due to the operating voltage to be applied to said conducting layer.

8. A device according to claim 7, wherein the impurity concentration of said first semiconductor region is in the range of $1.5 \times 10^{16}$ atoms/cc to $2 \times 10^{17}$ atoms/cc.

9. An insulated gate type field effect transistor comprising:
   a semiconductor body of a first conductivity type having a major surface;
   a source and a drain region of a second conductivity type formed in said major surface of said body;
   an insulating film covering said major surface of said body;
   a gate electrode formed on said insulating film so as to cover the major surface between said source and drain regions;
   a conducting layer connected to said gate electrode and extending over said insulating film; and
   a semiconductor layer of the first conductivity type formed in the entire portion of said major surface of said body except the surface portion of said body under said gate electrode, said semiconductor layer defining PN junctions with said source and drain regions and having a predetermined value of impurity concentration low enough to make the breakdown voltage of said PN junction higher than an operating voltage to be applied to said conducting layer but high enough for preventing an inversion layer from being induced in the surface of said semiconductor layer under said conducting layer due to the application of said operating voltage to said conducting layer.

10. A transistor according to claim 9, wherein said semiconductor body is made of N type silicon, said insulating film consisting essentially of silicon oxide and said semiconductor layer has an impurity concentration in the range of $1.5 \times 10^{16}$ atoms/cc to $2 \times 10^{17}$ atoms/cc.

11. An insulated gate type field effect device comprising:
   a semiconductor body of a first conductivity type having a major surface, a pair of source and drain regions of a second conductivity type formed in said semiconductor body;
   a first semiconductor region of the second conductivity type formed in sid semiconductor body and spaced from said source and drain regions;
   an insulating film covering the major surface of said body;
   a gate electrode formed on said insulating film so as to cover the major surface between said source and drain regions;
   a conductive layer connected to said gate electrode and a surface portion of said first semiconductor region formed on and extending over said insulating film;
   a conductive means for receiving an operating voltage connected to another surface portion of said first semiconductor region; and
   a second semiconductor region of the first conductivity type formed in the entire major surface of said body except the surface portion of said body lying under said gate electrode, said second semiconductor region defining PN junctions with said source region, said drain region and said first semiconductor region and having a predetermined value of impurity concentration low enough to make the breakdown voltage of said PN junctions higher than the operating voltage to be applied to said conductive means but high enough to prevent an inversion layer being induced in the surface of said second semiconductor region under said conductive layer due to the application of the operating voltage.

12. An insulated gate type field effect device according to claim 11, wherein the impurity concentration of said second semiconductor region is in the range of $1.5 \times 10^{16}$ atoms/cc to $2 \times 10^{17}$ atoms/cc.

13. A semiconductor device which comprises
   a. a semiconductor substrate which is of a first conductivity type and has one main surface,
   b. a plurality of semiconductor regions which are of a second conductivity type opposite to said first type and are formed on the main surface of said substrate,
   c. an insulating layer which is provided on said main surface and has openings, and
   d. a first and a second wiring metal layer which are provided on said insulating layer, and in which,
   said first wiring metal layer is provided through said insulating layer as an intermediary above a gate region formed between at least two neighboring semiconductor regions thereby to form a normal insulating gate type field effect transistor, another semiconductor region is provided adjacent to at least one of said semiconductor regions constituting said insulating gate type field effect transistor, and said second wiring metal layer is provided through said insulating layer as an intermediary above a region (parasitic gate region) between said at least one of the semiconductor regions and said other semiconductor region thereby to form a parasitic insulating gate type field effect transistor, characterized in that a high impurity concentration layer having the same conductivity type as that of said substrate and having an impurity concentration higher than that of said substrate is provided in a region which is in said one main surface of said semiconductor substrate and directly under said second wiring metal layer serving at least as the gate electrode of said parasitic insulating gate type field effect transistor, in such a manner that said high impurity concentration layer bridges said one of said semiconductor regions constituting said insulating gate type field effect transistor and said other semiconductor region under said second wiring metal layer and defines PN junctions therebetween, said high impurity concentration layer having a predetermined value of impurity concentration which is low enough to make the breakdown voltage of said PN junctions higher than an operating voltage applied to said second wiring metal layer and which is high enough not to induce a parasitic channel layer in said major surface of said substrate under said second wiring metal layer when the operating voltage is applied to said second wiring metal layer.

14. A semiconductor device as defined in claim 13, in which the impurity concentration of said high impurity concentration layer ranges from $1.5 \times 10^{16}$ atoms/cc to $2 \times 10^{17}$ atoms/cc.

15. A semiconductor device as defined in claim 13, in which said main surface of said semiconductor substrate is [100]-surface, the insulating layer provided on the substrate surface is $SiO_2$ film whose thickness is about 1000 A in the gate region of the normal insulating gate type field effect transistor formed on the substrate surface (gate insulating film) and about $1\mu$ in other regions, and the impurity concentration of said high impurity concentration layer ranges from $1.5 \times 10^{16}$ atoms/cc to $2 \times 10^{17}$ atoms/cc.

* * * * *